United States Patent [19]

Wheeler

[11] Patent Number: 5,169,221
[45] Date of Patent: Dec. 8, 1992

[54] PIVOTABLE DRAWER SLIDE MOUNT WITH PIVOT CONTROLLING GUIDE SLOT

[75] Inventor: Floyd C. Wheeler, Indianapolis, Ind.

[73] Assignee: General Devices Co., Inc., Indianapolis, Ind.

[21] Appl. No.: 821,124

[22] Filed: Jan. 16, 1992

Related U.S. Application Data

[63] Continuation of Ser. No. 577,452, Sep. 4, 1990, abandoned.

[51] Int. Cl.$^5$ .............................................. A47B 88/00
[52] U.S. Cl. .................... 312/323; 248/299; 16/358
[58] Field of Search ............ 312/322, 323, 330.1; 248/223.4, 286, 299; 16/358, 363; 361/338, 339, 340, 391

[56] References Cited

U.S. PATENT DOCUMENTS

| | | | |
|---|---|---|---|
| 2,584,173 | 2/1952 | Van Fowler | 361/391 X |
| 2,734,708 | 2/1956 | Cohn | 248/299 X |
| 2,775,501 | 12/1956 | Kyllo | 312/323 X |
| 2,869,958 | 1/1959 | Hough | 312/323 |
| 3,035,873 | 5/1962 | Fall | 312/339 X |
| 3,148,007 | 9/1964 | Bertrand . | |
| 4,200,342 | 4/1980 | Fall . | |
| 4,258,967 | 3/1981 | Boudreau | 312/280 X |
| 4,368,866 | 1/1983 | Urban | 248/286 |
| 4,827,439 | 5/1989 | Licht | 312/323 X |

Primary Examiner—Kenneth J. Dorner
Assistant Examiner—Brian K. Green
Attorney, Agent, or Firm—Barnes & Thornburg

[57] ABSTRACT

A pivotable slide track assembly has a drawer support plate appended to the drawer and a drawer slide. A pivot guide plate is attached to the drawer slide and formed to define a guide path therein. A follower appended to the drawer support plate follows the guide path defined within the pivot guide plate whereby the drawer and drawer support plate pivot relative to the pivot guide plate in response to movement of the drawer relative to the drawer slide.

5 Claims, 3 Drawing Sheets

PIVOTABLE DRAWER SLIDE MOUNT WITH PIVOT CONTROLLING GUIDE SLOT

This is a continuation of application Ser. No. 07/577,452, filed Sep. 4, 1990, now abandoned.

BACKGROUND AND SUMMARY OF THE INVENTION

This invention relates to drawer slide locking hardware and particularly to an improved mechanism for pivoting a pivotable mount coupled to a drawer slide track.

Convenient access to articles contained in cabinets, chests, or other storage devices can be encouraged by constructing movable drawers or shelving that can be easily extended outward from the body of the storage device when access is desired, and returned into the body of the storage device after the desired article is retrieved. A commonly employed mechanism for enabling the relative movement of a drawer and a storage device is a sliding track, such as described in U.S. Pat. No. 3,950,040 to Fall, or U.S. Pat. No. 4,089,568 to Fall et al., both herein incorporated by reference.

However, to ensure ready access to devices such as electronic components mounted in drawers, the removal of the drawer has generally been required. Although removing the drawer with mounted electronic components for servicing or replacement is feasible, because of the delicacy of many electronic components and the weight and general unwieldiness of the drawer, it is possible to damage the electronic components if the drawer is removed from its supporting slide tracks. This is a particular problem for large consumer electronics such as wide screen television sets, in which the electronic components may be positioned far inside the cabinet. To prevent damage to the electronic components of televisions during service or maintenance, provision of an apparatus that permits a drawer with mounted electronics to be extended outward from the television cabinet and rotated to a serviceable position without requiring displacement of the drawer from a slide track is desired.

In accordance with the present invention a drawer pivot assembly includes a drawer and a drawer support plate appended to the drawer. A drawer slide that is attached to a pivot guide plate and the pivot guide plate is formed to define a guide path therein. Following means is appended to the drawer support plate for following the guide path defined within the pivot guide plate. As the the drawer and drawer support plate are moved relative to the pivot guide plate in response to pivoting movement of the drawer relative to the drawer slide, the following means and guide path cooperate to guide the drawer to a desired position.

In preferred embodiments the guide path defined within the pivot guide plate is formed by a first guide slot defined by the pivot guide plate. The pivot guide plate can also be formed to include a second guide slot. The following means can include first and second guide posts mounted to the drawer support plate to respectively project from the drawer support plate and ride in the first and second guide slots defined in the pivot guide plate.

In other preferred embodiments, the guide slots have a start and a finish, and are respectively connected to starting and finishing slots that define resting positions for the drawer support plate. The guide posts are mounted to project from the drawer support plate and can slidably or rollingly ride in the first and second guide slots. When the guide posts move to either the starting or finishing slot, further rotation of the drawer support plate is prevented. Intermediate slots can also be formed connecting to the first or second guide slots to allow the drawer support plate to rest in an orientation rotated some predefined amount relative to the drawer slide.

A feature of this invention is a drawer slide assembly that enables a drawer to be extended from a cabinet and reversibly rotated from a home position to a pivoted position. In addition, the drawer can be extended from a cabinet and rotated relative to a drawer slide track supporting the drawer between several different pivot positions.

An advantageous feature of the invention is that rotation of a drawer to a desired position is a one-handed operation. The drawer can be extended outward from a cabinet and slightly lifted to move the guide posts out of the starting slots where they rest in a home position into the guide slot. The drawer can then be upwardly or downwardly rotated to follow a predetermined guide path defined by the guide slot until it moves into either an intermediate or finishing slot, wherupon the guide posts drop into place in their resting position and further rotation of the drawer support plate and attached drawer is stopped. Of course, this one-handed operation can be reversed, with the drawer being moved from a finishing or intermediate position back to the starting home position.

Additional objects, features, and advantages of the invention will become apparent to those skilled in the art on consideration of the following detailed description of preferred embodiments exemplifying the best mode of carrying out the invention as presently perceived.

BRIEF DESCRIPTION OF THE DRAWINGS

The detailed description particularly refers to the accompanying figures in which.

DETAILED DESCRIPTION OF THE DRAWINGS

Figure 1:
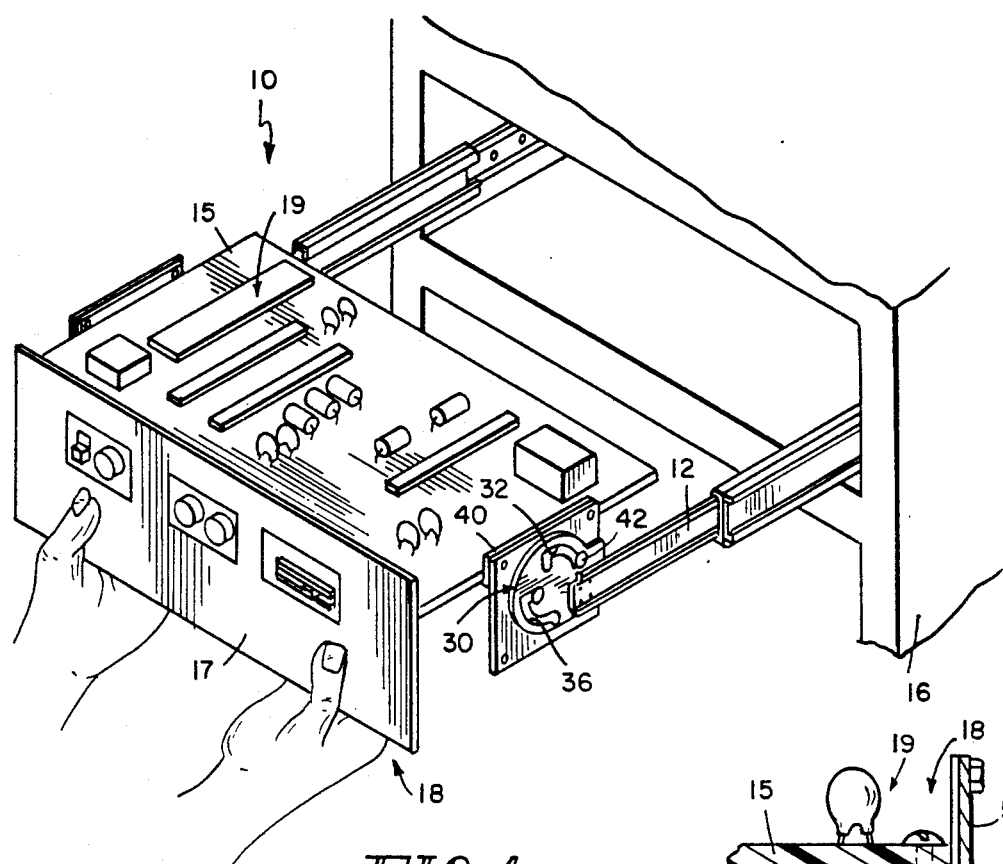
FIG. 1 is a perspective view showing a drawer movable on slide tracks and to which electronic components have been mounted, with the drawer being pulled outward from a cabinet to a home position so that the drawer is substantially parallel to the slide tracks.

A pivotable drawer slide assembly 10 is illustrated in an extended position in FIG. 1. The pivotable drawer slide assembly 10 includes a drawer 18 in which electronic components 19 are permanently mounted to a shelf 15. A frontpiece 17 to the drawer 18 is also attached to the shelf 15 so that it extends in a plane perpendicular to the plane of the shelf 15. The drawer 18, best shown in FIG. 1 and partially shown in FIGS. 2-5 for the purpose of clarity, can movably extend outward from the cabinet 16 to allow access to electronic components 19.

The drawer slide assembly 10 includes a first slide track 12 for sliding attachment to a second slide track 14 by way of an intermediate slide track 23 that couples in sliding attachment the slide tracks 12 and 14. The second slide track 14 is fixedly attached to a cabinet 16. Corresponding slide tracks are provided in the opposite side of the drawer 18 and in conjunction with tracks 12 and 14 support drawer 18. In the following description, discussion of the elements of the drawer slide assembly 10 applies to elements on both sides of the drawer 18. This arrangement permits the drawer 18 to be extended outward from the cabinet 16 since the second slide track 14 slidably supports the intermediate slide track 23, which in turn supports the drawer 18.

Figure 3:
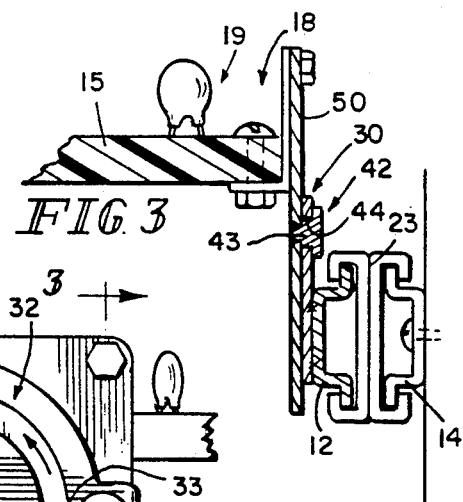
FIG. 3 is a front view of the assembly shown in FIG. 2, showing a pivot guide plate supporting a drawer support plate having a guide post projecting outward to ride in a slot defined in the pivot guide plate.
Figure 2:
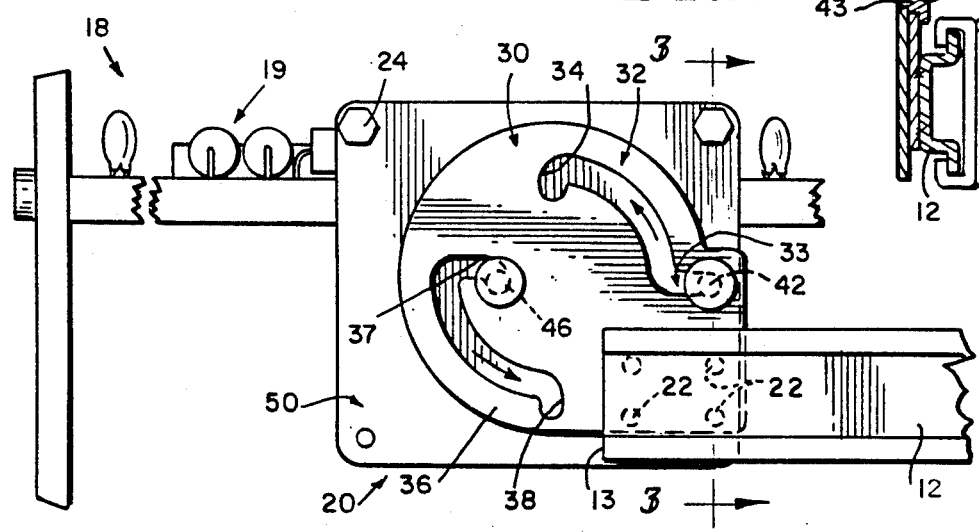
FIG. 2 is a partial side view of a drawer slide assembly showing a drawer support plate attached to the drawer and held in a starting home position by guide posts resting in the starting slot.
Figure 4:
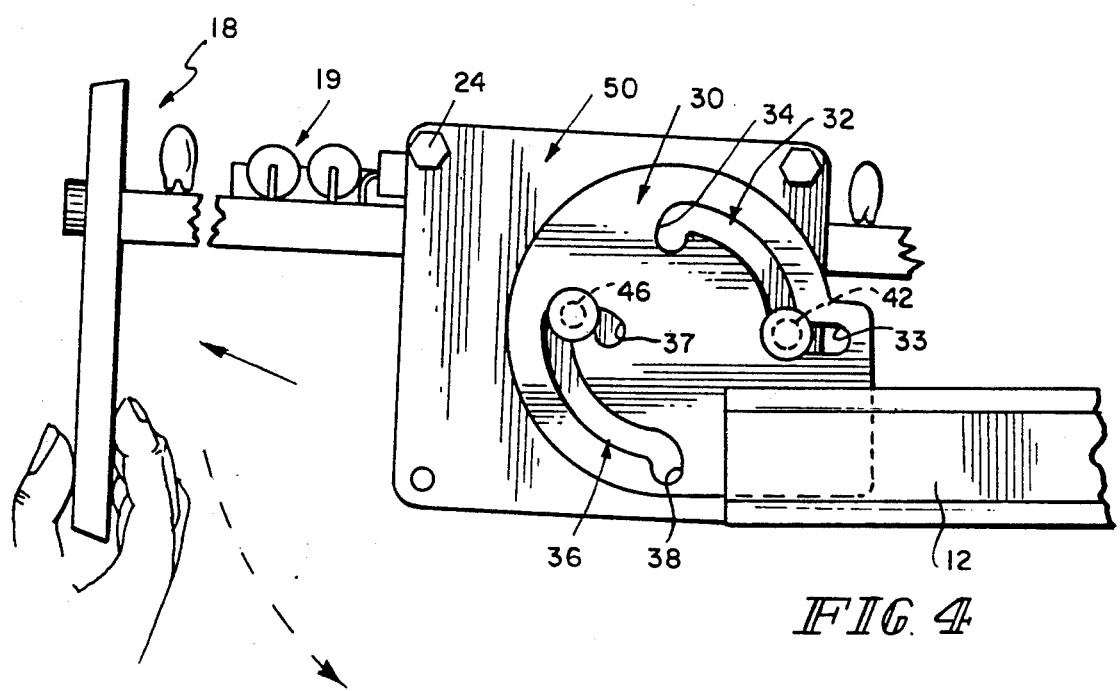
FIGS. 4 and 5 illustrate one handed pivotable rotation of the drawer, with FIG. 4 showing the drawer being moved upward slightly to move the guide post out of its rest position in the starting slot and to the start of the guide slot, and with FIG. 5 showing the drawer in its pivot position with the guide posts resting in the finishing slots.

A pivot assembly 20 connects the drawer 18 to the first slide 12. The pivot assembly 20 includes a pivot guide plate 30 that is immovably attached to the first slide track 12 by rivets 22. As best shown in FIGS. 2 and 3, the pivot guide plate 30 is formed to define first and second guide slots 32 and 36 that extend along a predetermined arcuate guide path. In the embodiment shown in FIGS. 1-5, the guide slots 32 and 36 substantially form mirror images of each other. Joining the first guide slot 32 at either end are respectively a starting slot 33 and a finishing slot 34. Similarly, and again as a mirror image of slot 33 and 34, a starting slot 37 and finishing slot 38 that communicate with the second guide slot 36 are also defined in the pivot guide plate 30.

The shelf 15 of the drawer 18 is immovably attached by mounting bolts 24 to a drawer support plate 50. Guide posts 42 and 46 are mounted on the drawer support plate 50 to project outward from predefined regions in the plate 50 through the guide slots 32 and 36. The guide posts 42 and 46 follow the guide paths provided by the guide slots 32 and 36. The guide posts 42 and 46 include pins 44 having an attached heads 43 (best shown in FIG. 2). The pins 44 are selected to have radial dimensions less than the width of the guide slots 32 and 36, and the heads 43 are selected to have radial dimensions larger than the width of the guide slots 32 and 36, preventing withdrawal of the guide posts 42 and 46 from the guide slots 32 and 36. This dimensioning also acts to prevent separation of the drawer plate 50 from the pivot guide plate 30.

Figure 5:
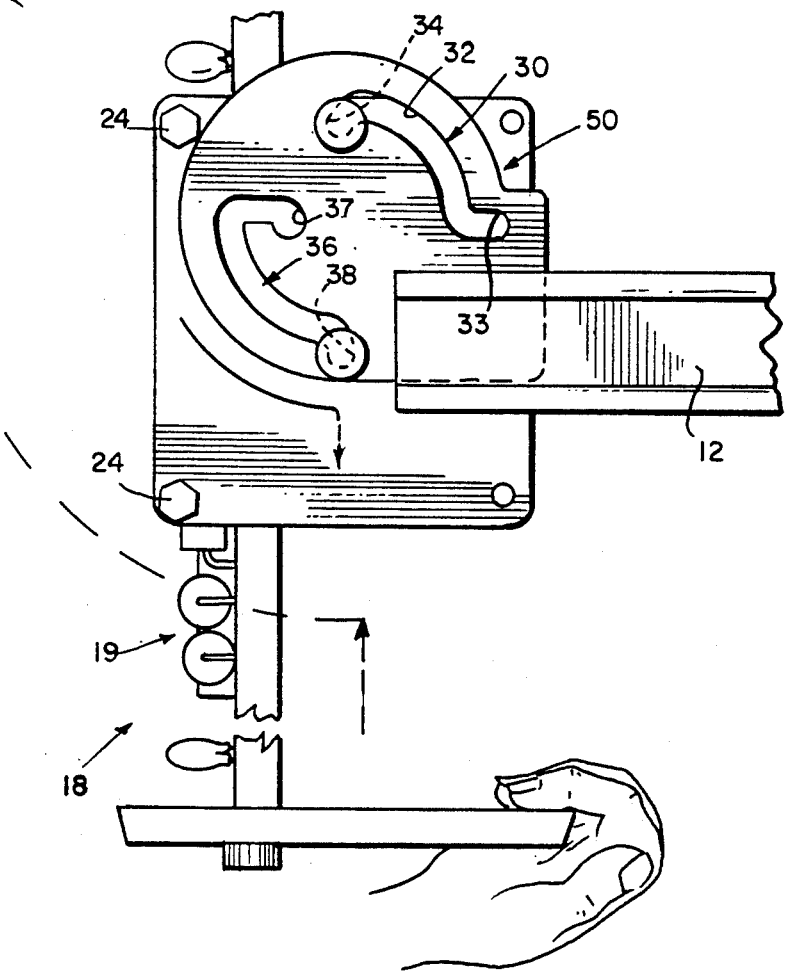
Figure 6:
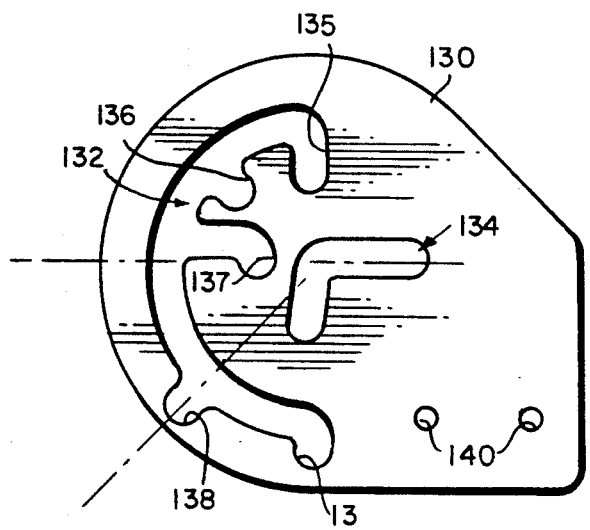
FIGS. 6–10 illustrate various embodiments of the pivot guide plate of the present invention having non-symmetric guide paths formed by guide slots in which guide posts can ride.
Figure 7:
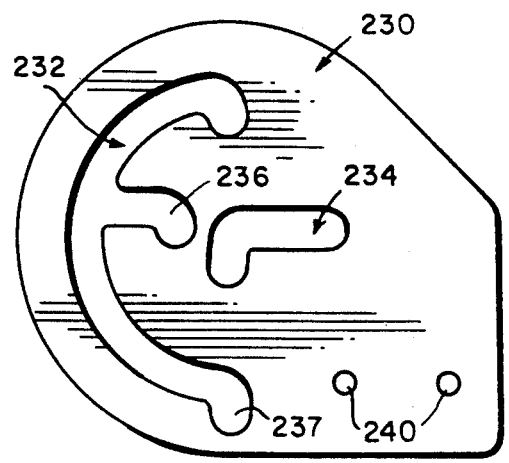
Figure 8:
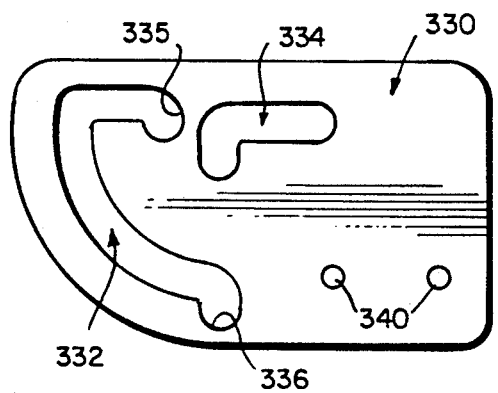
Figure 9:
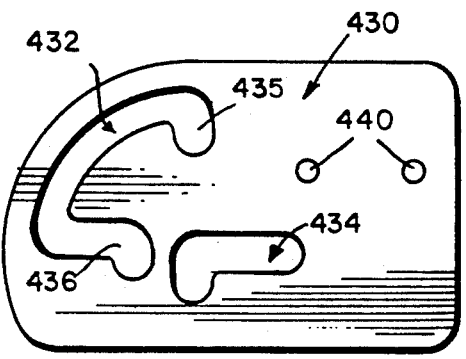
Figure 10:
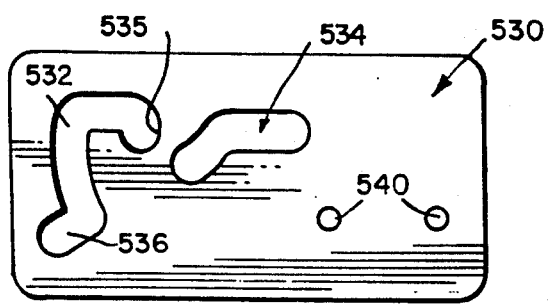

In operation, the drawer 18 can be pulled out from its cabinet 16 by grasping and outwardly pulling the frontpiece 17. When the shelf 15 is free of the cabinet 16, the drawer is ready to be pivoted from its starting home position shown in FIGS. 1-3 to a finishing position as shown in FIG. 5. The drawer 18 is grasped and slightly moved upward and outward from the cabinet 16. This respectively moves the guide posts 42 and 46 out of their resting position in the starting slots 33, 37 to a position at the start of the guide slots 32 and 36. The drawer 18 can be allowed to slowly drop, and will pivot as the guide posts 42 and 46 slide or roll along a guide path (indicated by the arrows in FIG. 2) defined by the guide slots 32 and 36. When the guide posts 42 and 46 reach the finish of the guide slots 32 and 36, they respectively move into the finishing slots 34 and 38, where they drop into their pivoted rest position that prevents further rotation of the drawer 18 (illustrated in FIG. 5).

It will be understood that this procedure can be readily reversed, so that the drawer 18 can be moved from its pivoted finishing position with the guide posts 42 and 46 resting in the finishing slots 34 and 37 such as indicated in FIG. 5 to the starting home position as indicated in FIGS. 1 and 2. When the drawer 18 is back in its home position, the first slide track 12 can be slidably moved inward to the cabinet 16 to place the drawer 18 back inside the cabinet 16.

FIGS. 6-10 illustrate alternative guide paths defined by first guide slots 132, 232, 332, 432, and 532 respectively in pivot guide plates 130, 230, 330, 430, and 530. The guide slots respectively connect to starting slots 135, 235, 335, 435, and 535 and terminate in finishing slots 136, 236, 336, 436, and 536. The pivot guide plates 130, 230, 330, 430, and 530 also respectively define second guide slots 134, 234, 334, 434, and 534. Any of these pivot plates can form part of the pivot assembly 20 illustrated in FIGS. 1-5 by attaching the pivot plates to the first slide 12 through one of the rivet holes 140, 240, 340, 440, or 540. The designs shown as 6 and 7 have the additional advantage in that intermediate slots 131, 137, 138, and 236 are also defined in the pivot guide plates. These intermediate slots permit the drawer to be held in pivoted positions at various angles between the start position and the finish position.

Although the invention has been described in detail with reference to certain preferred embodiments, variations and modifications exist within the scope and spirit of the invention as described and defined in the following claims.

What is claimed is:
1. A drawer pivot assembly comprising:
  a drawer support plate means for attachment to a sliding drawer;
  a pivot guide plate means having at least two guide slot means therein;
  a drawer slide means attached to said pivot guide plate means to permit horizontal reciprocating movement of said pivot guide plate means;
  drawer guide means attached to said drawer support plate means and engaged in the at least two guide slot means of said pivot guide plate means for pivoting the drawer support plate means with respect to the pivot guide plate means;
  wherein two of said at least two guide slot means each have a configuration including arcuate guide path portion means for permitting the drawer support plate means to pivot with respect to the pivot guide plate means about an axis located offset from and between said arcuate guide path portion means of said two of said at least two guide slots as the drawer guide means traverse the arcuate guide path portion means.

2. The drawer pivot assembly of claim 1 wherein the drawer guide means includes at least one guide post.

3. The drawer pivot assembly of claim 1 wherein the arcuate guide path portion means face one another in a mirror configuration so that bottom and top ends of the arcuate path portion means are closer to one another than middle portions of the arcuate path portion means.

4. The drawer assembly of claim 3 wherein the guide slot means have straight portions to allow the drawer support plate means to translate with respect to the pivot guide plate means.

5. The drawer assembly of claim 1 wherein the guide slot means have straight portions to allow the drawer support plate means to translate with respect to the pivot guide plate means.

* * * * *